US 8,124,962 B2

(12) United States Patent
Kang

(10) Patent No.: US 8,124,962 B2
(45) Date of Patent: Feb. 28, 2012

(54) ORGANIC LIGHT EMITTING DEVICE AND METHOD OF FABRICATING THE SAME

(75) Inventor: Tae-Wook Kang, Suwon-si (KR)

(73) Assignee: Samsung Mobile Display Co., Ltd., Nongseo-Dong, Giheung-Gu, Yongin, Gyunggi-Do (KR)

( * ) Notice: Subject to any disclaimer, the term of this patent is extended or adjusted under 35 U.S.C. 154(b) by 86 days.

(21) Appl. No.: 11/269,840

(22) Filed: Nov. 9, 2005

(65) Prior Publication Data

US 2006/0097251 A1    May 11, 2006

(30) Foreign Application Priority Data

Nov. 11, 2004  (KR) .................. 10-2004-0092123

(51) Int. Cl.
*H01L 29/08* (2006.01)

(52) U.S. Cl. ....... 257/40; 257/91; 257/98; 257/E51.018; 257/E51.019; 257/E51.02; 257/E51.021; 257/E51.022

(58) Field of Classification Search .................... 257/49, 257/98, 40, 99, E51.018–E51.022, 91
See application file for complete search history.

(56) References Cited

U.S. PATENT DOCUMENTS

| | | | | |
|---|---|---|---|---|
| 6,759,689 | B2 * | 7/2004 | Adomi et al. ................. | 257/98 |
| 2002/0011976 | A1 * | 1/2002 | Hashimoto ................. | 345/76 |
| 2003/0230972 | A1 * | 12/2003 | Cok ........................... | 313/504 |
| 2004/0195961 | A1 * | 10/2004 | Lin ............................ | 313/504 |
| 2004/0245531 | A1 * | 12/2004 | Fuii et al. .................. | 257/88 |
| 2005/0116620 | A1 * | 6/2005 | Kobayashi ................. | 313/503 |
| 2006/0033422 | A1 * | 2/2006 | Chao et al. ................. | 313/500 |
| 2006/0038752 | A1 * | 2/2006 | Winters ..................... | 345/76 |

FOREIGN PATENT DOCUMENTS

| | | |
|---|---|---|
| CN | 1432854 | 7/2003 |
| JP | 2002-318553 | 10/2002 |

(Continued)

OTHER PUBLICATIONS

Office Action from the Chinese Patent Office issued in Applicant's corresponding Chinese Patent Application No. 200510120358.9 dated Apr. 11, 2008.
Office Action from the Japanese Patent Office issued in Applicant's corresponding Japanese Patent Application No. 2005-154319 dated May 20, 2008.

(Continued)

*Primary Examiner* — Minchul Yang
(74) *Attorney, Agent, or Firm* — Robert E. Bushnell, Esq.

(57) ABSTRACT

In an organic light emitting device and method of fabricating the same, a hole is formed in a reflecting layer formed below a first electrode or the reflecting layer itself is patterned to form a reflecting layer pattern, and an opening is formed in the reflecting layer positioned below the first electrode, so that light generated in an organic layer is transmitted toward the bottom as well as the top, and an aperture ratio of the opening may be adjusted to control the amount of the transmitted light and the reflected light. The organic light emitting device includes: a substrate; a first electrode; an organic layer having at least an organic emission layer; and a second electrode formed on the substrate. A reflecting layer is positioned below the first electrode, and has at least one hole or at least one island pattern formed therein. An aperture ratio of the opening may be adjusted so that a double-sided organic light emitting device capable of adjusting the amount of the reflected light and the transmitted light may be readily formed.

19 Claims, 9 Drawing Sheets

FOREIGN PATENT DOCUMENTS

| | | |
|---|---|---|
| JP | 2003-345271 | 12/2003 |
| JP | 2004-355813 | 12/2004 |
| JP | 2005-347269 | 12/2005 |
| JP | 2006-019142 | 1/2006 |
| JP | 2006-511374 | 4/2006 |
| WO | WO 2004/068910 | 8/2004 |

OTHER PUBLICATIONS

"Chinese Certificate of Patent" issued by Chinese Patent Office on Mar. 25, 2009 for Applicant's corresponding Chinese Patent Application No. 200510120358.9.

* cited by examiner

ORGANIC LIGHT EMITTING DEVICE AND METHOD OF FABRICATING THE SAME

CLAIM OF PRIORITY

This application makes reference to, incorporates the same herein, and claims all benefits accruing under 35 U.S.C. §119 from an application for ORGANIC ELECTROLUMINESCENCE DEVICE AMD METHOD FOR FABRICATING THEREOF earlier filed in the Korean Intellectual Property Office on 11 Nov. 2004 and there duly assigned Ser. No. 10-2004-0092123.

BACKGROUND OF THE INVENTION

1. Field of the Invention

The present invention relates to an organic light emitting device and method of fabricating the same and, more particularly, to an organic light emitting device and method of fabricating the same, in which a hole is formed in a reflecting layer formed below a first electrode or the reflecting layer itself is patterned to have a reflecting layer pattern, and an opening is formed in the reflecting layer positioned below the first electrode, so that light generated in an organic layer maybe emitted toward a bottom surface as well as a top surface, and an aperture ratio of the opening may be adjusted to control the amount of transmitted light and reflected light.

2. Description of the Related Art

In recent years, attentions has been paid to flat panel display devices including a liquid crystal display (LCD) device, the organic light emitting display device, and the plasma display panel (PDP), which devices overcome the drawbacks of the conventional cathode ray tube (CRT), which is heavy-weighted and large-sized.

In this case, the LCD device is not an emissive device but is a non-emissive device so that it is limited in brightness, contrast and viewing angle and has a large size. The PDP is an emissive device but it is heavier than other flat panel display devices, and it requires high power consumption and a complicated fabrication method. The organic light emitting display device is an emissive device which is advantageous in terms of viewing angle, contrast, etc., and it does not require a backlight so that power consumption may also be reduced. Thus, a small-sized and lightweight organic light emitting display device may be implemented.

In addition, the organic light emitting display device may be driven by a direct current low voltage and it has a fast response speed. Moreover, the organic light emitting display device is made of a solid material so that it has the advantages of a wide temperature range and high durability against external impact, while also being fabricated by a simple and low-cost fabrication method.

Organic light emitting devices are classified into top-emitting organic light emitting devices and bottom-emitting organic light emitting devices. In the top-emitting organic light emitting device, light propagating toward the top of the device is composed of transmitted light propagating toward the top, and reflected light propagating toward the bottom and then reflected so as to propagate toward the top. In the bottom-emitting organic light emitting device, light generated in the device becomes transmitted light when it propagates toward the bottom but becomes reflected light when it propagates toward the bottom. However, a problem occurs when it is desired to form a double-sided organic light emitting device using the top-emitting or bottom-emitting organic light emitting device.

SUMMARY OF THE INVENTION

The present invention, solves the aforementioned problems by providing an organic light emitting device and method for fabricating the same, in which a hole is formed in a reflecting layer formed below a first electrode, or the reflecting layer itself is patterned to have a reflecting layer pattern, and an opening is formed in the reflecting layer positioned below the first electrode, so that light generated in an organic layer may be emitted toward a bottom surface as well as toward a top surface, and an aperture ratio of the opening may be adjusted to control the amount of transmitted light and reflected light.

In an exemplary embodiment of the present invention, an organic light emitting device comprises: a substrate; a first electrode; an organic layer having at least an organic emission layer; and a second electrode formed on the substrate. Moreover, a reflecting layer is positioned below the first electrode, and has at least one penetrated hole or is provided with at least one island pattern.

In another exemplary embodiment of the present invention, a method of fabricating an organic light emitting device comprises the steps of: preparing a substrate; depositing a reflecting layer on the substrate; patterning the reflecting layer material to form a reflecting layer having a hole or an island pattern; forming a first electrode on the substrate; and forming an organic layer having at least an organic emission layer and a second electrode on the substrate.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIGS. 1A and 1B are a plan view and a cross-sectional view, respectively, of a top-emitting organic light emitting device, while

FIGS. 6A and 6B, are a plan view and a cross-sectional view, respectively, of an organic light emitting device including a reflecting layer having a reflecting layer pattern in accordance with the present invention, while

DETAILED DESCRIPTION OF THE INVENTION

Figure 1A:
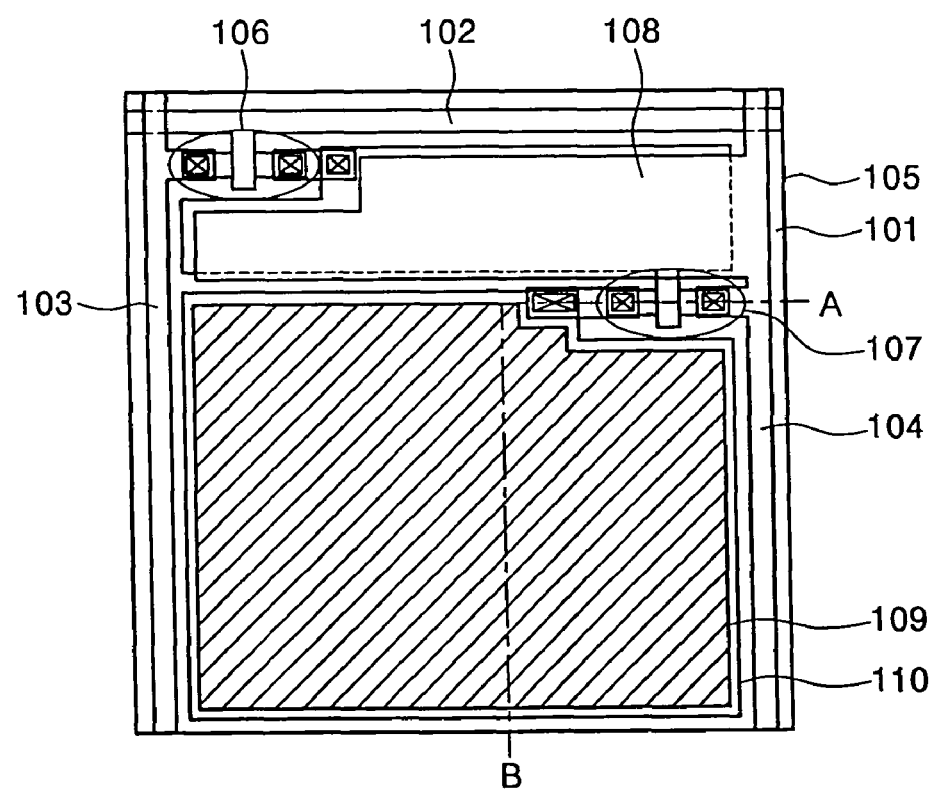

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure is thorough and complete and fully conveys the scope of the invention to those skilled in the art. The thicknesses of layers or regions shown in the drawings are exaggerated for clarity. The same reference numerals are used to denote identical elements throughout the specification.

Figure 1B:
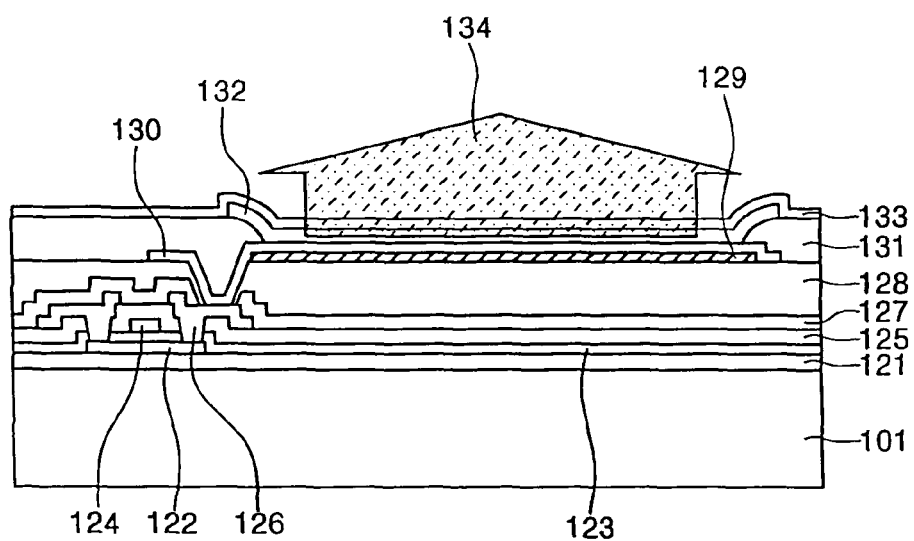
Figure 1C:
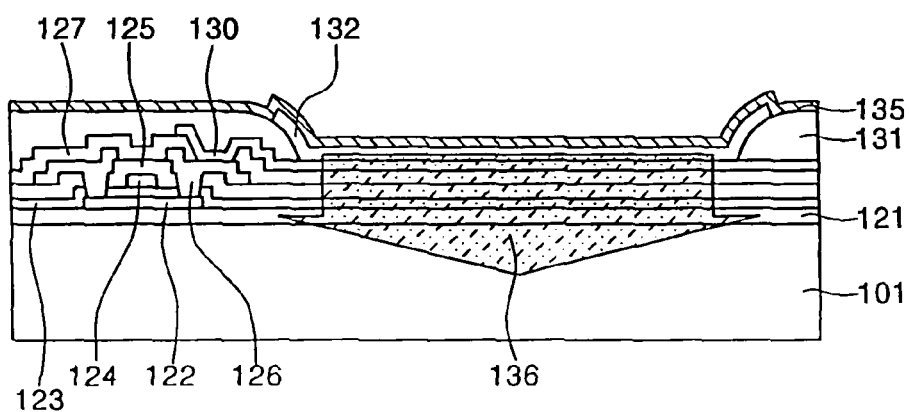
FIG. 1C is a cross-sectional view of a bottom-emitting organic light emitting device.

FIGS. 1A and 1B are a plan view and a cross-sectional view, respectively, of a top-emitting organic light emitting device, while FIG. 1C is a cross-sectional view of a bottom-emitting organic light emitting device.

Referring to FIG. 1A, a unit pixel 105, which is defined by lines such as a scan line 102, a data line 103, and a power line 104, is formed on a substrate 101 made of plastic or glass, and the unit pixel 105 includes: a thin film transistor (TFT) having a switching TFT 106 and a driving TFT 107; a capacitor 108 having a bottom electrode, a dielectric layer and a top electrode; and an emission region including a first electrode 110 with a reflecting layer 109 formed therebelow, an organic layer (not shown) having at least an organic emission layer, and a second electrode (not shown). The reflecting layer 109 and the first electrode 110 may also be a stacked layer formed by a single etching step.

In this case, the first electrode 110 of the top-emitting organic light emitting device is formed of a transparent material, such as Indium-Tin-Oxide (ITO) or Indium-Zinc-Oxide (IZO), which has a work function lower than that of the second electrode, and the reflecting layer 109 is formed of a metal material which has a high reflectivity and which is disposed below the first electrode 110.

Referring to FIG. 1B, which is a cross-sectional view taken along the line A-B of FIG. 1A, a buffer layer 121 serves to protect upper elements from the substrate 101; a TFT includes a semiconductor layer 122, a gate insulating layer 123, a gate electrode 124, an interlayer insulating layer 125, and source and drain electrodes 126; a passivation layer 127 serves to protect the lower TFT; and a planarization layer 128 for planarizing an emission region is formed on the substrate 101a.

A reflecting layer 129 is formed of a material capable of reflecting light on the emission region, a first electrode 130 is formed of a material allowing light to be transmitted and having a work function lower than that of a second electrode (not shown), a pixel defining layer 131 for defining pixels is formed, an organic layer 132 including at least an organic emission layer is formed, and a second electrode 133 is formed of a material allowing light to be transmitted and having a work function higher than that of the first electrode 130, thereby completing the formation of the top-emitting organic light emitting device.

In this case, by means of the reflecting layer 129 formed below the first electrode 110, light generated in the organic layer 132 is focused toward the top. That is, light 134 propagating toward the top is composed of transmitted light which is generated in the organic layer B2 so as to propagate toward the top, and reflected light generated in the organic layer 132 so as to propagate toward the bottom, and then reflected by the reflecting layer 129 so as to propagate toward the top.

As shown in FIG. 1C, which is a cross-sectional view of a bottom-emitting organic light emitting device, a substrate 101, a buffer layer 121, a semiconductor layer 122, a gate insulating layer 123, a gate electrode 124, an interlayer insulating layer 125, source and drain electrodes 126, a passivation layer 127, a first electrode 130, a pixel defining layer 131, and an organic layer 132 are formed by the same method as that described with reference to FIG. 1B. However, the bottom-emitting organic light emitting device differs from the top-emitting organic light emitting device in that a reflecting layer is not formed below the first electrode 130, and the second electrode is formed of a material allowing light to be reflected so that light 136 generated in the organic layer 132 propagates toward the bottom. That is, unlike the top-emitting organic light emitting device, the light generated in the organic layer 132 of the bottom-emitting organic light emitting device becomes transmitted light when it propagates toward the bottom, but it becomes reflected light which is reflected by the second electrode so as to propagate toward the bottom in the bottom-emitting organic light emitting device.

In this case, in order to form a double-sided organic light emitting device using the top- or bottom-emitting organic light emitting device, transmittance of the reflecting layer 129 or the second electrode is adjusted, or a top-emitting unit pixel and a bottom-emitting unit pixel are concurrently formed on the same substrate. However, this causes a problem in a resonating structure and the process becomes complicated when the transmittance is adjusted in order to form the double-sided organic light emitting device.

FIGS. 2 thru 4, 5A and 5B are cross-sectional views showing the process of forming an organic light emitting device in accordance with the present invention.

Figure 2:
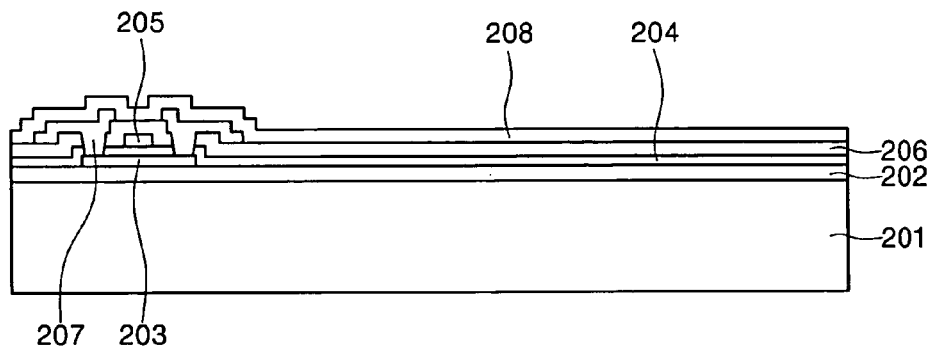
FIGS. 2 thru 4, 5A and 5B are cross-sectional views showing the process of forming an organic light emitting device in accordance with the present invention.

More Specifically, FIG. 2 is a cross-sectional view showing a process of forming a buffer layer 202, a semiconductor layer 203, a gate insulating layer 204, a gate electrode 205, an interlayer insulating layer 206, source and drain electrodes 207, and a passivation layer 208 on a substrate 201. As shown in the figure, the buffer layer 202 is formed on a substrate 201 made of plastic or glass, and the buffer layer 202 serves to prevent impurities, such as moisture or gas generated in the substrate 201, from diffusing or penetrating into upper elements.

Subsequently, an amorphous silicon layer is formed on the buffer layer 202, and is subjected to dehydrogenation and crystallization, so that a polycrystalline silicon layer is obtained and is then patterned to form the semiconductor layer 203.

A gate insulating layer 204 is then formed from a single layer or a stacked layer of silicon oxide or silicon nitride on the substrate 201 using a chemical vapor deposition (CVD) method or a physical vapor deposition (PVD) method.

A material for forming a gate electrode 205 is then deposited on the substrate 201 and is patterned to form the gate electrode 205.

An interlayer insulating layer 206 is formed from a single layer or a stacked layer of silicon oxide or silicon nitride on the entire surface of the substrate 201, and predetermined regions of the gate insulating layer 203 and the interlayer insulating layer 206 are etched to form a via hole which exposes the semiconductor layer 203. A material for forming source and drain electrodes 207 is deposited on the substrate 201, and is patterned to form the source and drain electrodes 207, and a passivation layer 208 is formed on the entire surface 201 of the substrate to protect lower elements.

Figure 3:
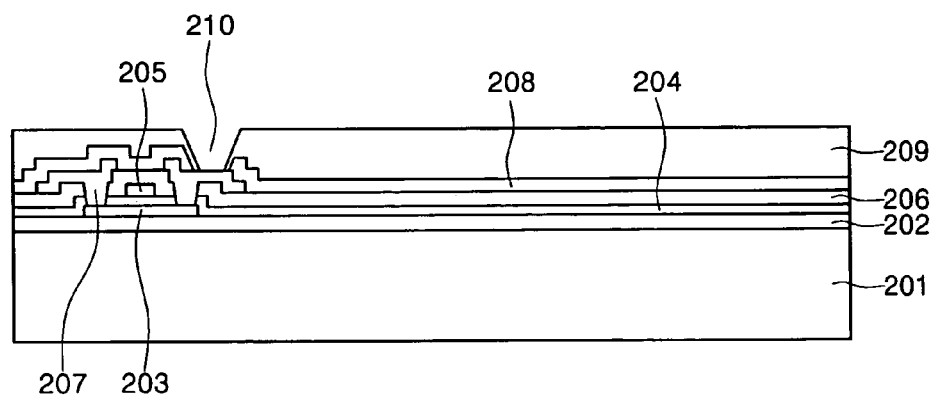

FIG. 3 is a cross-sectional view showing a process of forming a planarization layer on the substrate 201, and then forming a via hole for exposing the source and drain electrodes 207. As shown in the figure, a predetermined region of the interlayer insulating layer 206 is etched to form a planarization layer 209 which exposes a portion of the source and drain electrodes 207 and planarizes the entire surface of the substrate 201 A predetermined region of the planarization layer 209 is etched to form a via hole 210 which exposes the source and drain electrodes 207.

Figure 4:
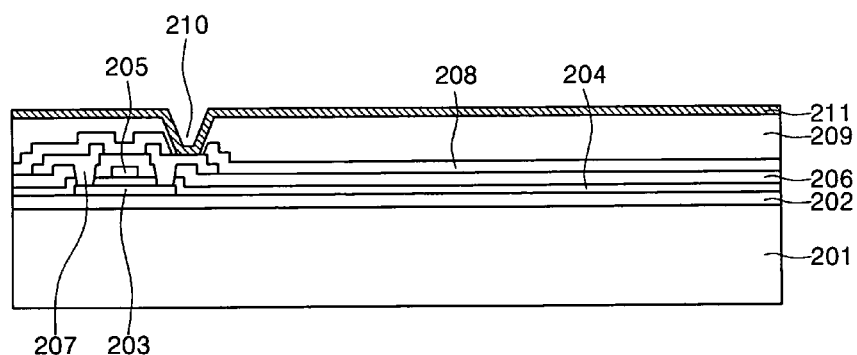

FIG. 4 is a cross-sectional view showing a process of depositing a material for forming a reflecting layer on the substrate. As shown in the figure, the reflecting layer formation material 211 is deposited on the entire surface of the substrate 201.

In this case, the reflecting layer formation material 211 is formed of aluminum (Al), argentum (Ag), an alloy thereof, or a combination of two or more of the latter materials. Preferably, the reflecting layer formation material 211 is formed of a material having a high reflectivity.

Figure 5A:
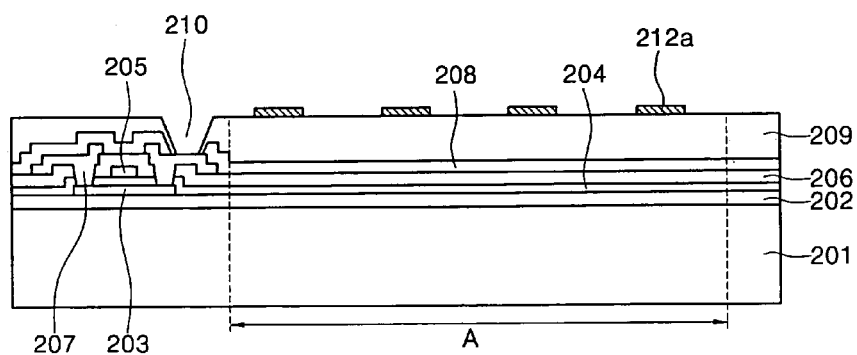

FIG. 5A is a cross-sectional view showing a process of etching the reflecting layer formation material 211, and forming a reflecting layer pattern to form a reflecting layer in accordance with an embodiment of the present invention. As shown in the figure, the reflecting layer formation material 211 formed on an emission region A in the substrate is patterned to form a reflecting layer pattern 212a.

In this case, the reflecting layer pattern 212a is formed so as to have an island pattern within the emission region A, wherein the shape of the pattern may be varied to be a circle, a triangle, a rectangle, and the like.

In addition, the island shape of the reflecting layer pattern 212a within one unit pixel may be varied, and its size may also be varied. In addition, the reflecting layer pattern 212a may have different sizes and shapes from one island pattern to another between unit pixels. In particular, they may be formed to be different from each other in red color (R), green color (G), and blue color (B) unit pixels.

Figure 5B:
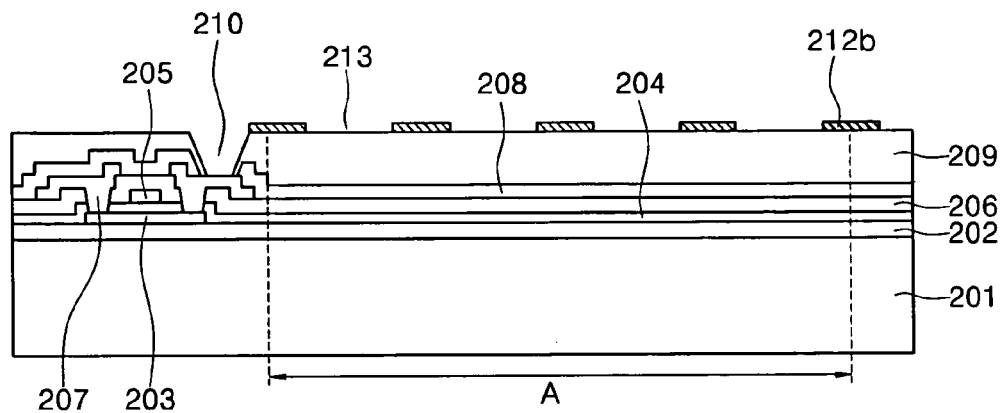

FIG. 5B is a cross-sectional view showing a process of etching the reflecting layer formation material to form a reflecting layer having holes in accordance with another embodiment of the present invention. As shown in the figure, the reflecting layer formation material formed on the substrate 201 is etched to form a reflecting layer pattern 212b having holes 213.

In this case, the holes 213 may be formed to have various shapes and sizes like the reflecting layer pattern 212b, and may be formed to have different shapes and sizes from each other within a unit pixel or per unit pixel.

Figure 6A:
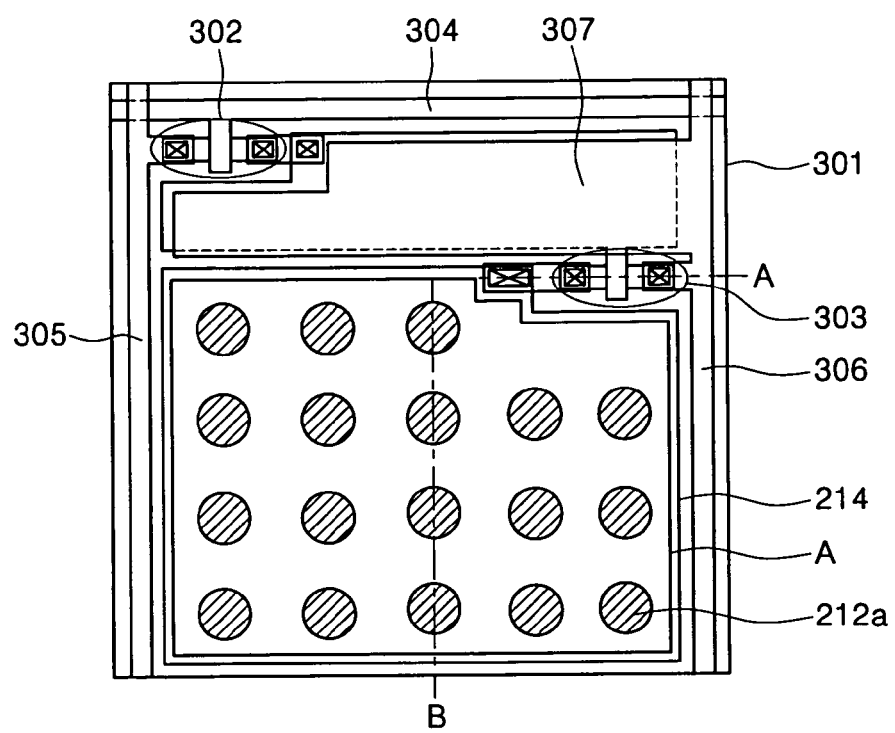
Figure 6B:
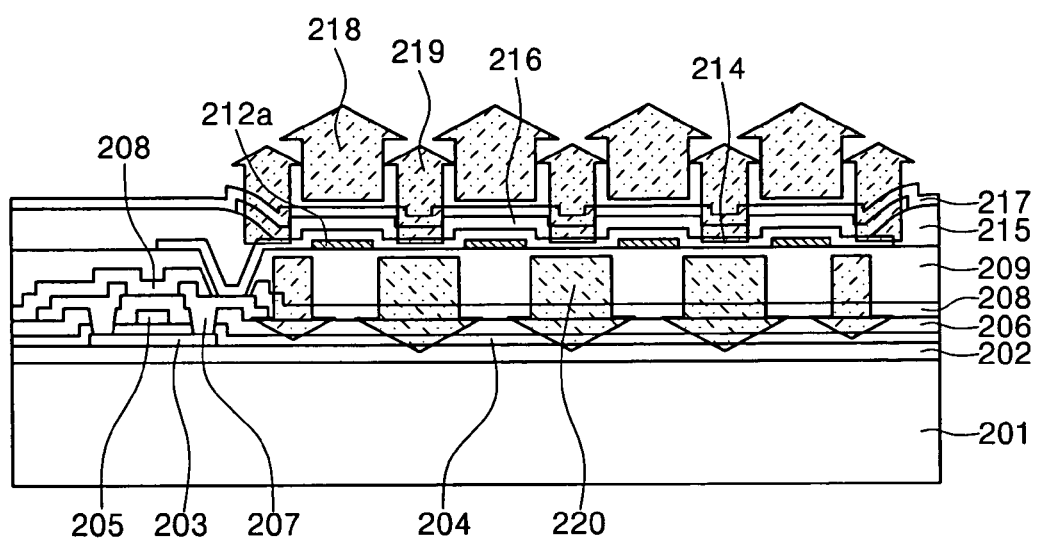

FIGS. 6A and 6B are a plan view and a cross-sectional view, respectively, of an organic light emitting device including a reflecting layer having a reflecting layer pattern in accordance with the present invention.

The same process as that described with reference to FIG. 2 is used to form a buffer layer 202, a semiconductor layer 203, a gate insulating layer 204, a gate electrode 205, an interlayer insulating layer 206, source and drain electrodes 207, and an interlayer insulating layer 208 on a substrate 201. As a result, as shown in FIG. 6A, a scan line 304, a data line 305, a common power line 306, and a capacitor 307, which are not described with reference to FIG. 2, as well as a switching TFT 302 and a driving TFT 303, may be concurrently formed within one unit pixel 301.

A passivation layer 208 and a planarization layer 209 are then formed on the substrate as described above with reference to FIGS. 3, 4 and 5A, and a reflecting layer formation material is deposited thereon and then patterned to form a reflecting layer made of a reflecting layer pattern 212a within an emission region A. In this case, the shape of the reflecting layer pattern in FIG. 6A is circular, but it may be varied as described above.

A first electrode 214 is then formed on the substrate, a pixel defining layer 215 for defining pixels is formed, an organic layer 216 including at least an organic emission layer is formed, and a second electrode 217 is formed, thereby completing the formation of the organic light emitting device.

In this case, as shown in FIG. 6B, among light generated in the organic layer 216, all light generated in a region where the reflecting layer pattern 212a is present below the first electrode 214 is reflected by the reflecting layer pattern 212a so as to be transmitted toward the top, and some light generated in a region where the reflecting layer pattern 212a is not present below the first electrode 214 is transmitted toward the bottom, so that a double-sided organic light emitting device may be implemented.

In this case, the amount of light transmitted toward the bottom is in inverse proportion to the surface area occupied by the reflecting layer pattern 212a in the emission region A, and the amount of light transmitted toward the top is in proportion to the surface area of the reflecting layer pattern 212a. In addition, the amount of light transmitted toward the top is different from that transmitted toward the bottom, even when the region where the reflecting layer pattern 212a is present has the same area as the region where the reflecting layer pattern 212a is not present. This is because the light transmitted toward the top includes light 218 which is composed of the transmitted light initially propagating toward the top and the reflected light which initially propagates toward the bottom and is then reflected by the reflecting layer pattern 212a among light generated in the organic layer 216, in addition to the transmitted light 219 which is transmitted toward the top among the light generated in the region where the reflecting layer pattern 212a is not present, whereas the light which propagates toward the bottom is composed of only the transmitted light 220 which propagates toward the bottom.

Accordingly, the total area of the reflecting layer pattern 212a may be adjusted to control the amount of light transmitted toward the top and that transmitted toward the bottom, and the amount of light transmitted toward the top increases when the total area increases.

Figure 7A:
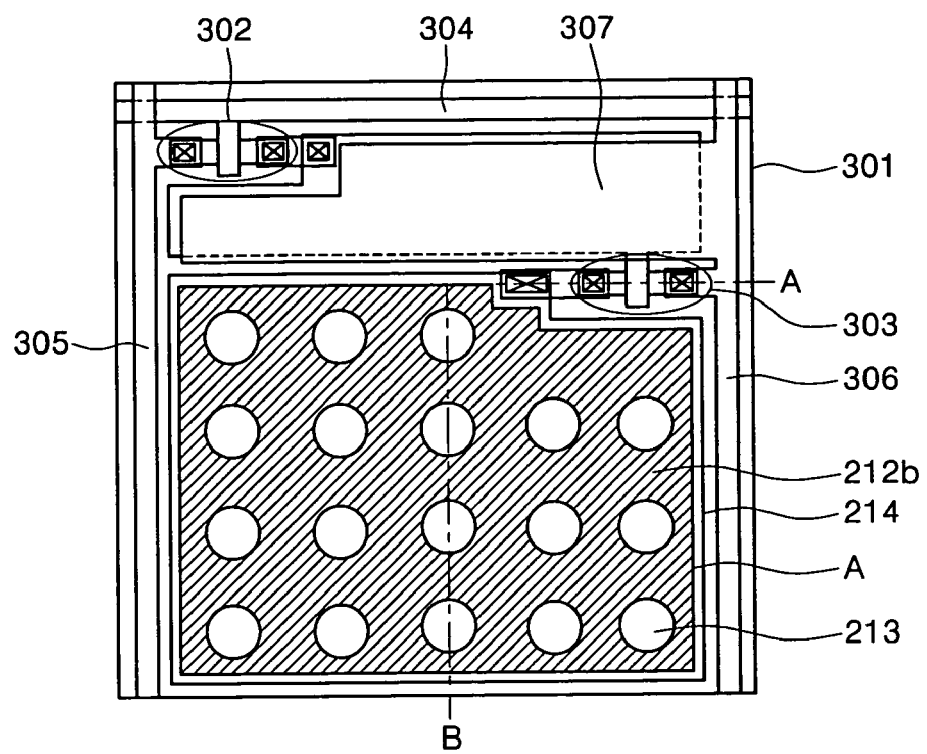
FIGS. 7A and 7B are a plan view and a cross-sectional view, respectively, of as organic light emitting device including a reflecting layer having holes in accordance with the present invention.
Figure 7B:
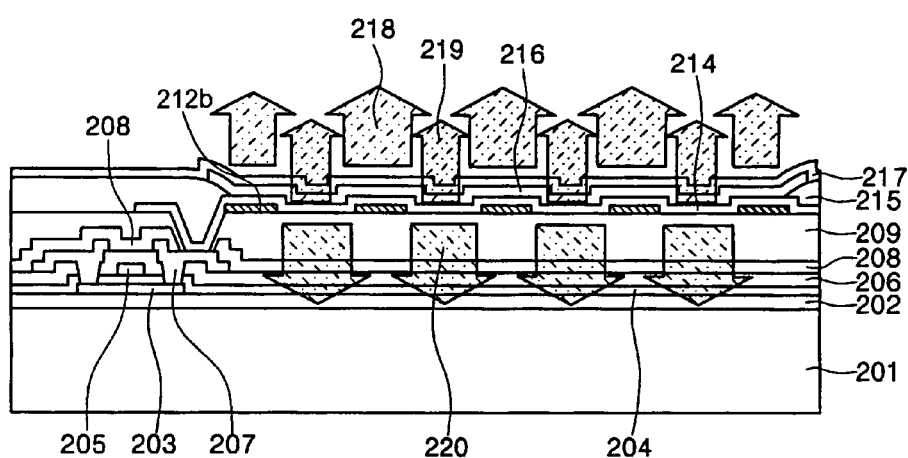

FIGS. 7A and 7B are a plan view and a cross-sectional view, respectively, of an organic light emitting device including a reflecting layer where holes are formed in accordance with the present invention.

Referring to FIG. 7A, it can be seen that a switching TFT 302, a driving TFT 303, a scan line 304, a data line 305, a common power line 306, and a capacitor 307 are formed within a unit pixel 301, and a reflecting layer formation material as described with reference to FIG. 4 is etched to form a reflecting layer pattern 212b having holes 213 in a predetermined region of the emission region A.

A first electrode 214 is then formed on the substrate 201, a pixel defining layer 215 for defining pixels is formed, an organic layer 216 including at least an organic emission layer is formed, and a second electrode 217 is formed, thereby completing the formation of the organic light emitting device.

In this case, as shown in FIG. 7B, among light generated in the organic layer 216, all light generated in a region where the reflecting layer pattern 212b is present below the first electrode 214 is reflected by the reflecting layer pattern 212b so as to be transmitted toward the top, and some light generated in a region where the reflecting layer pattern 212b is not present below the first electrode 214 is transmitted toward the bottom, so that a double-sided organic light emitting device may be implemented.

In this case, among light generated in the organic layer 216, the light propagating toward the top, as described with reference to FIGS. 6A and 6B, is the sum of light 218 generated in the region where the reflecting layer pattern 212b below is present (e.g. the light is composed of the transmitted light which is transmitted toward the top and the reflected light which is transmitted toward the bottom and then reflected by the reflecting layer pattern 212b) and light 219 propagating toward the top from the region where the holes are formed, whereas light 220 transmitted toward the bottom is composed of only the transmitted light which is transmitted toward the bottom among the light generated in the region where the holes are formed.

In addition, as shown in FIGS. 6B and 7B, the reflecting layer is formed of a reflecting layer pattern 212b or it is formed to have holes, so that the first electrode 214, the organic layer 216, and the second electrode 217 above the reflecting layer have unevenness, which leads to an increase in the emission area. In addition, by means of the unevenness of the organic layer 216 resulting from the unevenness of the reflecting layer, a path of light generated in the organic emission layer of the organic layer 216 may be diversified, which allows the luminous efficiency to be increased so that the efficiency of the organic light emitting device may be increased.

According to the organic light emitting device and method of fabricating the same, a hole or holes may be formed in the reflecting layer, or the reflecting layer itself may be formed to have an island pattern to form an opening, and an aperture ratio of the opening may be adjusted, so that a double-sided organic light emitting device capable of adjusting the amount of the reflected light and the transmitted light may be readily formed, and the emission surface area may be increased by means of the unevenness resulting from the hole or the island pattern, and luminous efficiency may be increased by means of diversification of the light propagation path.

Although the present invention has been described with reference to certain exemplary embodiments thereof, it will be understood by those skilled in the art that a variety of modifications and variations may be made to the present invention without departing from the spirit or scope of the present invention as defined in the appended claims, and their equivalents.

What is claimed is:

1. An organic light emitting device, comprising:
a substrate;
a first electrode formed on the substrate;
an organic layer including at least an organic emission layer formed on the substrate;
a second electrode formed on the substrate; and
a reflecting layer positioned below the first electrode:
wherein the reflecting layer is one pattern having at least one hole, and the reflecting layer is formed in one unit pixel; and
wherein said at least one hole comprises holes having different sizes from each other in one unit pixel.

2. The organic light emitting device as recited in claim 1, further comprising a thin film transistor, a capacitor, a scan line, a data line, and a power line formed in a predetermined region of the substrate.

3. The organic light emitting device as recited in claim 1, wherein the reflecting layer is formed of at least one of aluminum (Al), silver (Ag), and an alloy thereof.

4. The organic light emitting device as recited in claim 1, wherein a surface area of an emission region increases when a number of said at least one hole increases.

5. The organic light emitting device as recited in claim 1, wherein said at least one hole has a shape of one of a circle and a polygon.

6. An organic light emitting device, comprising:
a substrate;
a first electrode formed on the substrate;
an organic layer including at least an organic emission layer formed on the substrate;
a second electrode formed on the substrate; and
a reflecting layer positioned below the first electrode:
wherein the reflecting layer is one pattern having at least one hole, and the reflecting layer is fonned in one unit pixel; and
wherein said at least one hole comprises holes having a same size in one unit pixel but different sizes from each other per unit pixel.

7. An organic light emitting device, comprising:
a substrate;
a first electrode formed on the substrate;
an organic layer including at least an organic emission layer formed on the substrate;
a second electrode formed on the substrate; and
a reflecting layer positioned below the first electrode:
wherein the reflecting layer is one pattern having at least one hole, and the reflecting layer is formed in one unit pixel; and
wherein said at least one hole comprises holes of red (R), green (G), and blue (B) pixels of the organic light emitting device having different sizes from each other.

8. The organic light emitting device as recited in claim 1, fabricated by steps comprising:
preparing the substrate;
depositing reflecting layer formation material on the substrate;
patterning the reflecting layer formation material to form the reflecting layer;
forming the first electrode on the substrate;
forming the organic layer including the organic emission layer on the substrate; and
forming the second electrode on the substrate.

9. The organic light emitting device as recited in claim 8, further comprising:
a thin film transistor, a capacitor, a scan line, a data line, and a power line formed in a predetermined region of the substrate;
the reflecting layer being formed of at least one of aluminum (Al), silver (Ag), and an alloy of aluminum (Al) and silver (Ag); and
said at least one hole comprising holes of red (R), green (G), and blue (B) pixels of the organic light emitting device having different sizes from each other.

10. An organic light emitting device, comprising:
a substrate;
a first electrode formed on the substrate;
an organic layer including at least an organic emission layer formed on the substrate;
a second electrode formed on the substrate; and
a reflecting layer positioned below the first electrode,
wherein the reflecting layer is an at least two island pattern in one unit pixel, with said one unit pixel emitting only one of red, green and blue colored light; and
wherein said at least two island pattern is formed on a same layer.

11. The organic light emitting device as recited in claim 10, further comprising a thin film transistor, a capacitor, a scan line, a data line, and a power line formed in a predetermined region of the substrate.

12. The organic light emitting device as recited in claim 10, wherein the reflecting layer is formed of at least one of aluminum (Al), silver (Ag), and an alloy thereof.

13. The organic light emitting device as recited in claim 10, wherein a surface area of an emission region increases when a number of islands in said at least two island pattern increases.

14. The organic light emitting device as recited in claim 10, wherein said at least two island pattern comprises islands having a shape of one of a circle and a polygon.

15. The organic light emitting device as recited in claim 10, wherein said at least two island pattern comprises islands having different sizes from each other in one unit pixel.

16. The organic light emitting device as recited in claim 10, wherein said at least two island pattern comprises islands having a same size in one unit pixel but different sizes from each other per unit pixel.

17. The organic light emitting device as recited in claim 10, wherein said at least two island pattern comprises only one of islands of red (R), green (G), and blue (B) pixels of the organic light emitting device having different sizes from each other.

18. The organic light emitting device as recited in claim 10, fabricated by steps comprising:
  preparing the substrate;
  depositing reflecting layer formation material on the substrate;
  patterning the reflecting layer formation material to form the reflecting layer;
  forming the first electrode on the substrate;
  forming the organic layer including the organic emission layer on the substrate; and
  forming the second electrode on the substrate.

19. The organic light emitting device as recited in claim 18, further comprising:
  a thin film transistor, a capacitor, a scan line, a data line, and a power line formed in a predetermined region of the substrate;
  the reflecting layer being formed of at least one of aluminum (Al), silver (Ag), and an alloy of aluminum (Al) and silver (Ag); and
  said at least two island pattern comprising only one of islands of red (R), green (G), and blue (B) pixels of the organic light emitting device having different sizes from each other.

* * * * *